(12) United States Patent
Yagishita

(10) Patent No.: US 7,298,069 B2
(45) Date of Patent: Nov. 20, 2007

(54) CRYSTAL UNIT

(75) Inventor: Hiroaki Yagishita, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/713,683

(22) Filed: Nov. 14, 2003

(65) Prior Publication Data

US 2004/0095044 A1    May 20, 2004

(30) Foreign Application Priority Data

Nov. 15, 2002  (JP) .............................. 2002-331491
Aug. 26, 2003  (JP) .............................. 2003-301871

(51) Int. Cl.
*H01L 41/04* (2006.01)
*H03B 5/32* (2006.01)

(52) U.S. Cl. ................ 310/367; 310/330; 310/365; 331/158; 331/68

(58) Field of Classification Search ............... 331/158, 331/68; 310/330–332
See application file for complete search history.

(56) References Cited

U.S. PATENT DOCUMENTS 3,796,968 A * 3/1974 Luscher ........................ 331/67
4,167,686 A * 9/1979 Fukuyo ......................... 310/361
5,585,687 A * 12/1996 Wakabayashi et al. ....... 310/366
6,362,561 B1 * 3/2002 Kuroda et al. ............... 310/368
6,452,460 B2 * 9/2002 Oda .............................. 331/68
6,859,116 B2 * 2/2005 Nishimura et al. .......... 333/187
2003/0020564 A1 * 1/2003 Nishimura et al. .......... 333/187
2006/0175939 A1 * 8/2006 Murata ......................... 310/368

FOREIGN PATENT DOCUMENTS

JP         61-70425        5/1986
JP       2001-196886       7/2001

* cited by examiner

*Primary Examiner*—J. San Martin
(74) *Attorney, Agent, or Firm*—Katten Muchin Rosenman LLP

(57) ABSTRACT

A crystal unit has a crystal blank provided with a pair of excitation electrodes and a pair of extension electrodes extended from the excitation electrodes, and a casing having a recess. A pair of connection terminals is formed on the bottom face of the recess. An inclined surface is formed at one end of a first principal surface of the crystal blank and the second principal surface of the crystal blank is flat-shaped. A conductive material is disposed between the connection terminals and the extension electrodes so that the extension electrodes are extended toward the end at which the inclined surface is formed and the second principal surface faces the mounting member, and the crystal blank is thereby held by the mounting member at the position of the end at which the extension electrodes are extended and electrically connected to the connection terminals.

9 Claims, 4 Drawing Sheets

CRYSTAL UNIT

BACKGROUND OF THE INVENTION

1. Field of the Invention

The present invention relates to a quartz crystal unit, and more particularly, to a crystal unit having an excellent vibration characteristic and small dispersion in quality.

2. Description of the Related Arts

A surface mount crystal unit is widely used for an oscillator and the like as a reference source of frequency or time, especially in portable electronic devices since it is small and light. While miniaturization of a surface mount crystal unit is advancing more and more in recent years, the vibration characteristic of a crystal unit is required to be kept constant despite the miniaturization.

A conventional surface mount crystal unit shown in FIGS. 1A and 1B is realized by accommodating quartz crystal blank 2 in casing 1 made of laminated ceramics or the like, covering the opening of casing 1 with cover 3 and thereby hermetically sealing crystal blank 2 in casing 1. Casing 1 is suitable for surface mounting and provided with a recess having a substantially rectangular shape as a two-dimensional projected shape. A pair of connection terminals 4 used for an electrical connection with crystal blank 2 is provided at both sides of one end of the inner bottom surface of the recess. Connection terminals 4 are electrically connected to external terminals 5 provided on the outer surface of casing 1 via a conductive path (not shown) through the laminated plane of the laminated ceramics.

As shown in FIG. 2, crystal blank 2 has a substantially rectangular planar shape, and linear or curved inclined surfaces are formed on both principal surfaces of the crystal blank at both ends in the longitudinal direction of crystal blank 2. That is, both principal surfaces have so-called beveled surfaces or convex surfaces at both longitudinal ends of crystal blank 2. Excitation electrodes 6 are formed on the flat areas of both principal surfaces of crystal blank 2 and extension electrodes 7 are drawn out from excitation electrodes 6 toward both sides of one end of crystal blank 2 across the surface of the inclined surface at the one end. Extension electrodes 7 are folded over the principal surface on the opposite side at the position of the end face of crystal blank 2. Both sides of one end of crystal blank 2 to which extension electrodes 7 are extended are fixed onto the pair of connection terminals 4 through a conductive material, for example, conductive adhesive 8, and then crystal blank 2 is electrically and mechanically connected to casing 1 and held in the recess of casing 1. Then, by placing cover 3 so as to cover the recess, crystal blank 2 is hermetically sealed in casing 1. A crystal unit with inclined surfaces formed at both ends of a crystal blank on both principal surfaces and the crystal blank fixed to a casing by means of a conductive adhesive is disclosed in Japanese Patent Application Laid-Open No. 2001-196886 (JP, P2001-196886A).

Here, the process of fixing crystal blank 2 will be explained. As shown in FIG. 3, conductive adhesive 8 is normally applied to connection terminals 4 and then both sides of one end of crystal blank 2 on which the inclined surface is formed are positioned under a pressure indicated by arrow P. Then the assembly of casing 1 and crystal blank 2 is heated. Crystal blank 2 is thus secured through heating and hardening of conductive adhesive 8.

In the crystal unit manufactured through such a process, because of the inclined surfaces provided at both ends of crystal blank 2, vibration energy is trapped in the flat area in the center of crystal blank 2 and the vibration characteristic represented by crystal impedance (CI), etc., is thereby maintained satisfactorily.

However, the surface mount crystal unit in the above described conventional configuration has the following problems because the inclined surfaces of the crystal blank are fixed by means of conductive adhesive 8. That is, since both sides at one end of the inclined surface is pressed and then heated, the pressing force and pressing direction of the pressure applied to conductive adhesive 8 vary from one crystal blank to another depending on factors such as the positioning accuracy of the crystal blank. With such variations in the pressing force and pressing direction, the holding state and holding system also vary from one crystal blank 2 to another, causing variations in the holding state and thereby producing also non-uniformity in the vibration characteristic as the crystal unit. Furthermore, conductive adhesive 8 may wrap around from the inclined surface at the end of crystal blank 2 up to the flat area which is the vibration area and may deteriorate the vibration characteristic of the crystal unit as a consequence. These problems become noticeable because the influence of holding crystal blank 2 increases as the miniaturization of crystal blank 2 advances.

In the case of a crystal unit in a configuration with a crystal blank inserted between clamp type metal holding members, the configuration with inclined surfaces provided at both ends of one or both principal surfaces of the crystal blank is disclosed, for example, in Japanese Utility Model Application Laid-Open No. 61-70425 (JP, 61-70425, U).

SUMMARY OF THE INVENTION

It is an object of the present invention to provide a crystal unit whose vibration characteristic is maintained satisfactorily and has of stable quality.

The object of the present invention is attained by a crystal unit comprising a crystal blank provided with a pair of excitation electrodes and a pair of extension electrodes extended from the excitation electrodes, and a mounting member having a pair of connection terminals, wherein the crystal blank includes a first principal surface and a second principal surface, an inclined surface is formed at one end of the first principal surface, the second principal surface is flat-shaped, extension electrodes are extended toward the end at which the inclined surface is formed, and a conductive material is disposed between the connection terminals and the extension electrodes in such a way that the second principal surface faces the mounting member and the crystal blank is held by the mounting member at the position of the end to which the extension electrodes are extended and electrically connected to the connection terminals.

According to the present invention, when the crystal blank is fixed to the mounting member, the flat area of the crystal blank contacts the conductive material represented by the conductive adhesive. This allows pressing conditions such as the pressing force and pressing direction of a pressure applied to the crystal blank and conductive material to be controlled so that they are kept constant, and the crystal blank can be held uniformly and the quality of the finished crystal unit can also be stabilized. It further prevents a conductive adhesive or the like from wrapping around up to the vibration area of the crystal blank and keeps the vibration characteristic satisfactorily.

In the present invention, the mounting member is typically a casing suitable for surface mounting. This casing includes a recess and is provided with a pair of connection terminals on the bottom face of the recess. When such a casing is used, the crystal blank is fixed to the connection terminals, and then a cover is placed so as to cover the recess and in this way the crystal blank is hermetically sealed in the casing and the crystal unit is completed.

DETAILED DESCRIPTION OF THE INVENTION

Figure 1A:
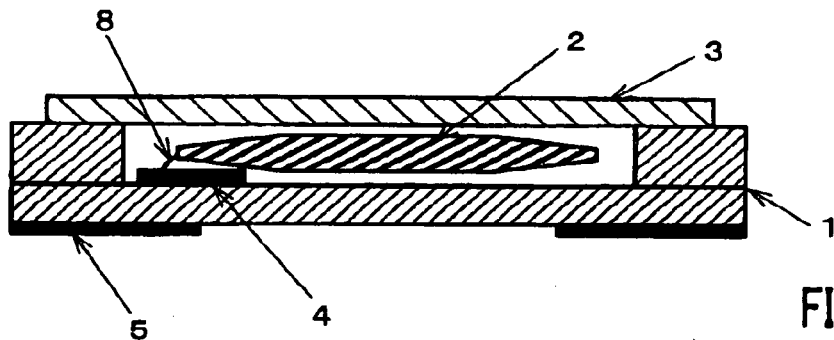
FIG. 1A is a sectional view showing an example of a conventional surface mount crystal unit.
Figure 1B:
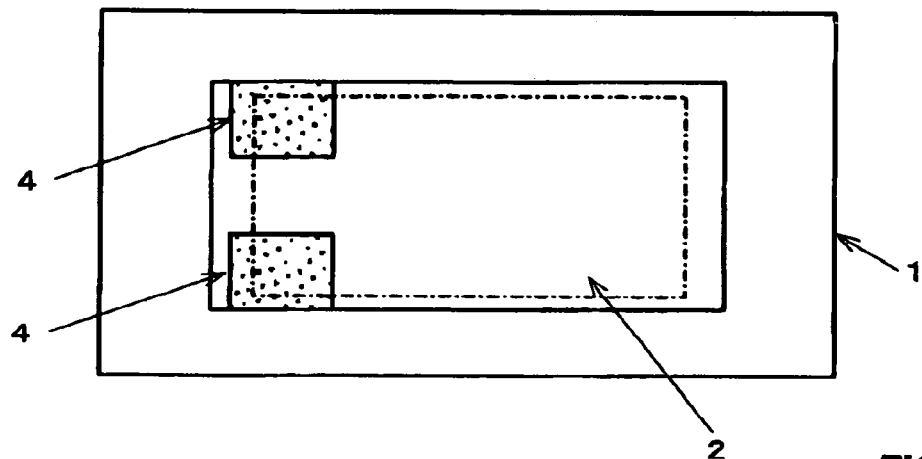
FIG. 1B is a plan view of the crystal unit shown in FIG. 1A with the cover removed.
Figure 2:
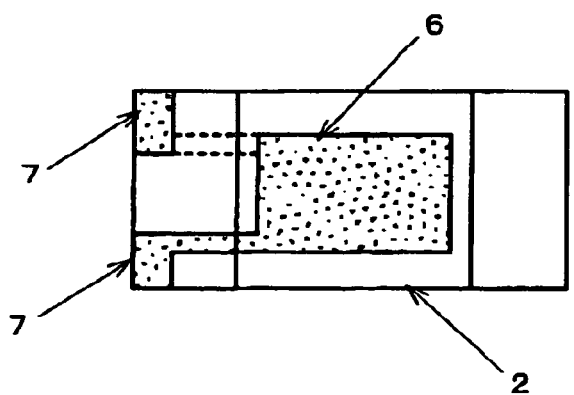
FIG. 2 is a plan view showing an example of a crystal blank.
Figure 3:
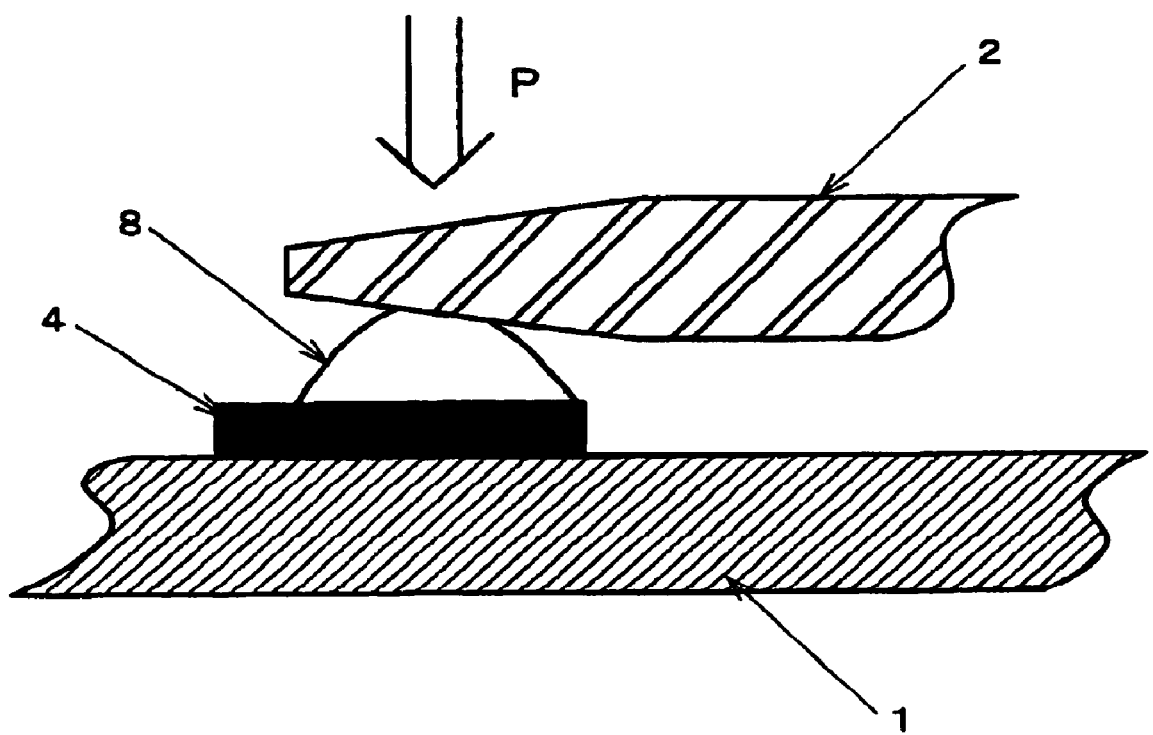
FIG. 3 is an enlarged partial view of the crystal unit shown in FIG. 1A.
Figure 4:
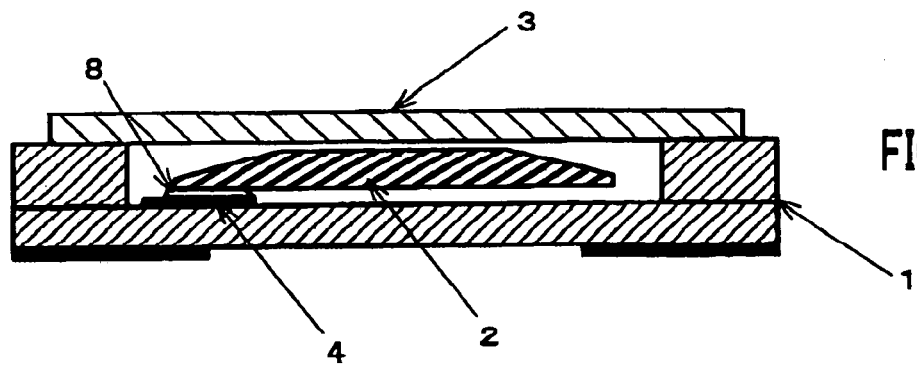
FIG. 4 is a sectional view of a surface mount crystal unit according to an embodiment of the present invention.

As in the case of the quartz crystal unit shown in FIGS. 1A and 1B, the crystal unit according to an embodiment of the present invention shown in FIG. 4 is realized by accommodating quartz crystal blank 2 in casing 1 made of laminated ceramics, covering the opening of casing 1 with cover 3 and thereby hermetically sealing crystal blank 2 in casing 1. As casing 1 used as the mounting member, a casing similar to that shown in FIGS. 1A and 1B is used, a pair of connection terminals 4 is provided on th bottom face of a recess of casing 1 and external terminals 5 electrically connected to connection terminals 4 are provided on the outer surface of casing 1.

Figure 5:
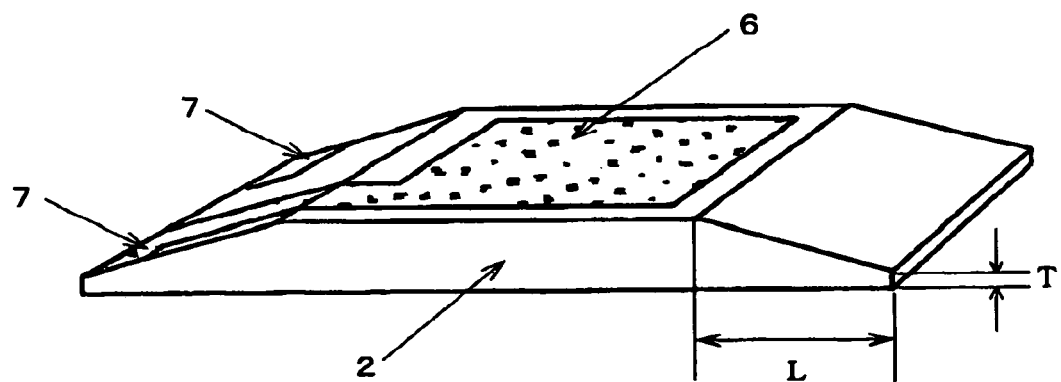
FIG. 5 is a perspective view of a crystal blank used in the crystal unit shown in FIG. 4.

As shown in FIG. 5, crystal blank 2 has a substantially rectangular shape as a two-dimensional projected shape and comprises, for example, an AT-cut quartz crystal blank. An AT-cut quartz crystal blank has a vibration mode by thickness-shear vibration. Crystal blank 2 has a first principal surface and a second principal surface, and linear inclined surface are formed on the first principal surface as beveled surfaces at both ends in the longitudinal direction of crystal blank 2. The second principal surface of crystal blank 2 is provided with no such inclined surface and is flat-shaped. Excitation electrode 6 is formed on the flat area of the first principal surface and another excitation electrode 6 is also formed on the second principal surface in such a way as to face excitation electrode 6 on the first principal surface. From these excitation electrodes 6, extension electrodes 7 are extended or drawn out toward both sides at one end of crystal blank 2. Extension electrodes 7 are formed in such a way that they are folded over the opposite principal surface at the tip end of crystal blank 2.

Crystal blank 2 is placed in such a way that the second principal surface of crystal blank 2 faces the bottom face of the recess of casing 1 and both sides at one end of crystal blank 2 toward which extension electrodes 7 are extended are fixed onto connection terminals 4 by means of conductive adhesive 8, and thereby electrically and mechanically connected to casing 1 and held level in the recess of casing 1. When crystal blank 2 is fixed, conductive adhesive 8 is applied to connection terminals 4 first, and then crystal blank 2 is positioned in such a way that the second principal surface faces down and both sides at one end of crystal blank 2 are placed on top of conductive adhesive 8 under a pressure indicated by arrow P in the figure. Then the assembly of casing 1 and crystal blank 2 is heated to harden conductive adhesive 8. Then, cover 3 is provided so as to cover the recess of casing 1 and in this way the crystal unit is completed.

Figure 6:
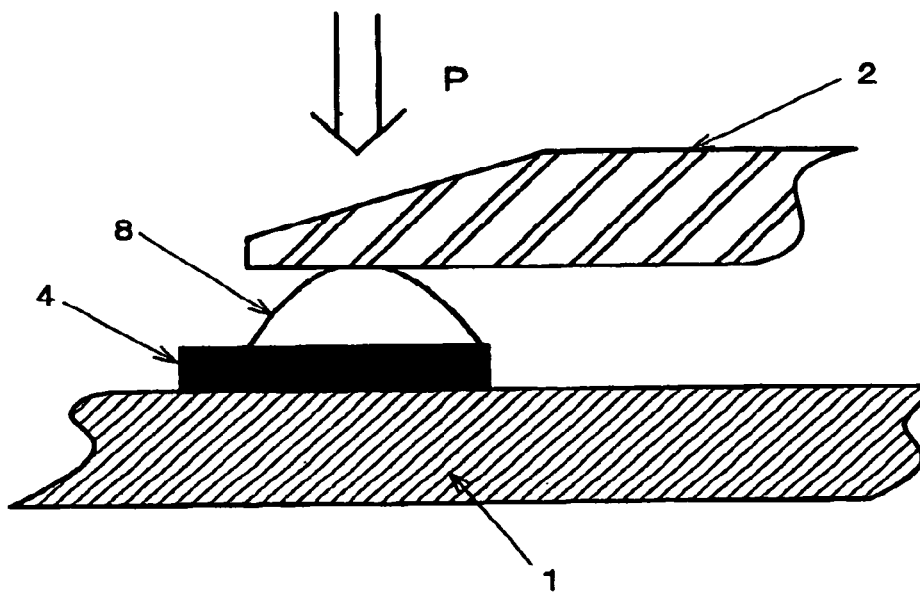
FIG. 6 is an enlarged partial view of the crystal unit shown in FIG. 4.

In such a configuration, conductive adhesive 8 applied to connection terminals 4 receives a pressing force from the flat surface of crystal blank 2 as shown in FIG. 6. Therefore, even if some deviation occurs when crystal blank 2 is positioned, the pressing force acts on conductive adhesive 8 in substantially the same direction and uniformly. This makes uniform the state in which crystal blank 2 is held for each crystal unit, reducing variations in the quality of the finished crystal unit. It also prevents conductive adhesive 8 from wrapping around up to the vibration area of crystal blank 2 and makes it possible to keep a good vibration characteristic.

Here, an example of the actually created crystal unit according to this embodiment will be explained. As the crystal blank, an AT-cut quartz crystal blank was used and made into approximately 1.5 mm×1.1 mm in size and its vibration frequency was set to 20 MHz. The thickness of the crystal blank in the vibration area is approximately 0.084 mm. Furthermore, length L of the inclined surface from the end of the crystal blank was set to 0.4 mm and thickness T at the end face of the inclined surface was set to 0.04 mm. Then, a conventional crystal blanks with inclined surfaces provided on both principal surfaces and the crystal blanks according to this embodiment were prepared and fixed to the respective casings and compared. As a result, the crystal blanks according to this embodiment showed a stable CI value of 30 Ω. On the contrary, when a good product was selected from among the conventional crystal blanks, a CI value of 30 Ω was obtained but its characteristic varied drastically from one crystal unit to another. From these results, it is evident that the present invention can provide a crystal unit whose vibration characteristic is maintained satisfactorily and of stable quality.

In this embodiment, the crystal blank is fixed and held with both sides at one end in the longitudinal direction of crystal blank 2, and therefore when mechanical shock is applied to the crystal blank, there is a danger that the other end of the crystal blank may collide with the bottom face of the recess of casing 1. In this case, since the underside of the crystal blank, that is, the second principal surface is flat-shaped, it is the tip at the other end and not the vibration area that collides with the bottom face of the recess. On the contrary, when inclined surfaces are formed on both principal surfaces as in the case of the conventional example, there is a danger that instead of part of the inclined surface at the other end colliding with the bottom face of the recess, the vibration area of a greater thickness may collide with the bottom face of the recess. From the standpoint of influences when mechanical shock is applied, the crystal unit according to this embodiment is more advantageous.

Figure 7:
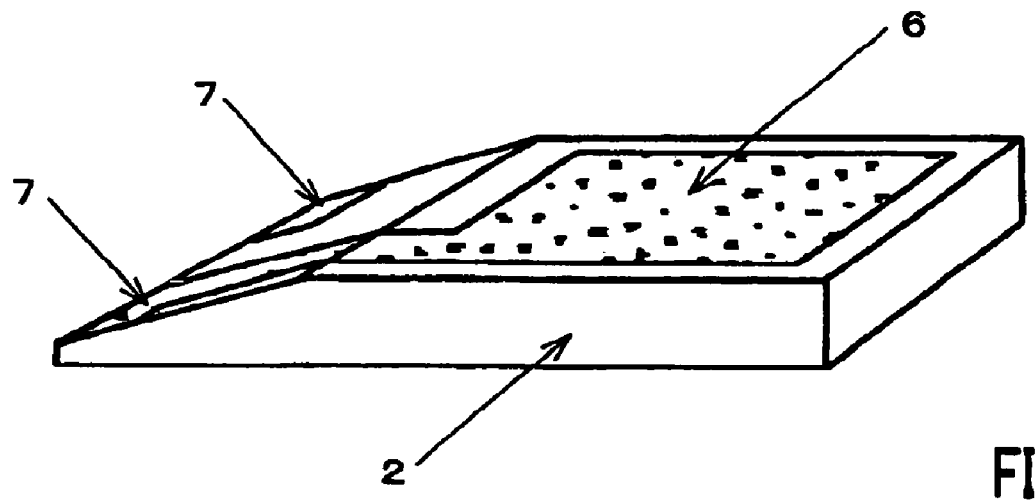
FIG. 7 is a perspective view showing another example of the crystal blank.

The crystal unit according to one embodiment of the present invention has been explained above, but the crystal blank usable for the present invention is not limited to the above described one. The crystal blank shown in FIG. 7 is one provided with an inclined surface at only one end in the longitudinal direction of crystal blank 2. No inclined surface is provided at the other end of crystal blank. In this case, too, the inclined surface is only provided on the first principal surface and the second principal surface is flat-shaped. Extension electrodes 7 are extended toward both sides at the end at which the inclined surface is provided. In this case, an effect similar to that described above can be obtained by fixing the crystal blank in such a way that the flat surface i.e., the second principal surface faces down at the end toward which extension electrodes 7 are extended.

Figure 8:
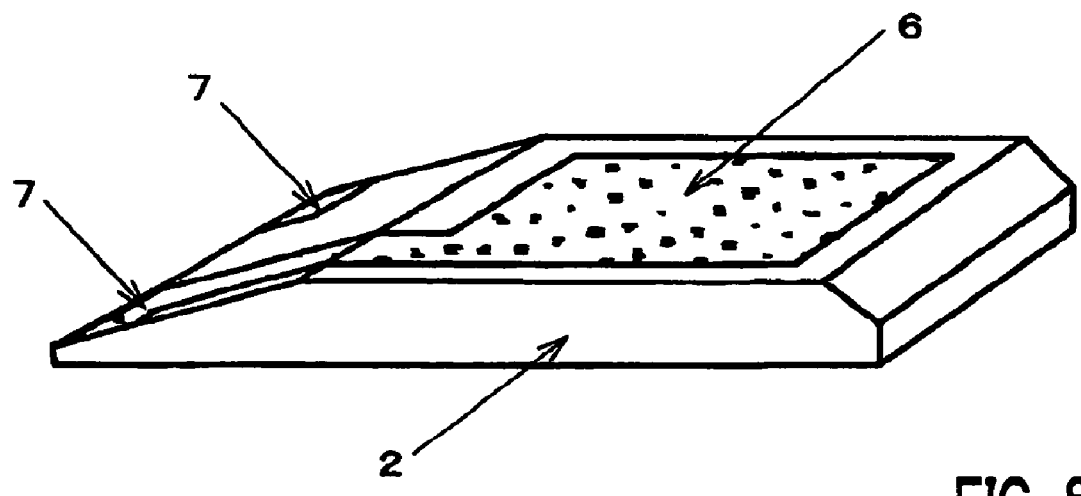
FIG. 8 is a perspective view showing a further example of the crystal blank.

The crystal blank shown in FIG. 8 is one with inclined surfaces provided at both ends of crystal blank 2, but the inclined surfaces are different from each other in size at the two ends. By providing the inclined surfaces at both ends, it is possible to enhance the trapping effect of vibration energy. In this case, extension electrodes 7 are extended toward the end having the greater inclined surface and crystal blank 2 is fixed at this end.

Furthermore, the present invention can also be adapted in such a way that the extension electrodes are extended, respectively, toward both ends in the longitudinal direction of the crystal blank. In this case, the crystal can be fixed to the case at both ends.

In the present invention, the shape of the inclined surfaces is not limited to a linear shape. For example, the inclined surfaces may also be finished to a curved shape. The ridge angle section of crystal blank 2 may be subjected to deburring using a barrel, etc., so as to take on roundness.

As the conductive material to electrically and mechanically connect the crystal blank to the connection terminals, it is also possible to use, for example, a eutectic alloy or bump instead of using a conductive adhesive. Furthermore, the mounting member to which the crystal blank is fixed is not limited to a recessed casing, but may also be a flat-shaped mounting member.

What is claimed is:

1. A crystal unit comprising:
    a crystal blank provided with a pair of excitation electrodes and a pair of extension electrodes extended from said excitation electrodes; and
    a mounting member on which a pair of connection terminals is formed,
    wherein said crystal blank has a first principal surface and a second principal surface, a first inclined surface is formed at a first end of said first principal surface, said first principal surface and said second principal surface being flat-shaped and parallel to each other, and said extension electrodes are extended toward the first end at which said first inclined surface is formed,
    wherein a conductive material is disposed between said connection terminals and said extension electrodes in such a way that said second principal surface faces said mounting member and said crystal blank is held by said mounting member at the position of the end to which said extension electrodes are extended and electrically connected to said connection terminals;
    wherein one of the excitation electrodes is arranged on the first principal surface and the other of the excitation electrodes is arranged on the second principal surface opposite the one of the excitation electrodes arranged on the first principal surface, the excitation electrodes being parallel to each other;
    wherein a second inclined surface is formed at a second end of said crystal blank opposite the first end; and
    wherein said inclined surfaces are different from each other in size at the respective ends and said extension electrodes are extended toward the greater inclined surface, and
    the second inclined surface does not extend to said second principal surface.

2. The crystal unit according to claim 1, wherein said conductive material comprises a conductive adhesive.

3. The crystal unit according to claim 1, wherein said extension electrodes are extended toward both sides of one end of said crystal blank.

4. The crystal unit according to claim 1, wherein:
    said crystal blank has a substantially rectangular shape as a two-dimensional shape;
    said inclined surfaces are formed at both ends in a longitudinal direction of said crystal blank.

5. The crystal unit according to claim 1, wherein said mounting member is a casing having a recess and said connection terminals are formed on the bottom face of said recess.

6. The crystal unit according to claim 5, further comprising a cover which covers said recess, wherein said crystal blank is hermetically sealed in said recess with said cover.

7. The crystal unit according to claim 1, wherein said crystal blank comprises an AT-cut quartz crystal unit.

8. The crystal unit according to claim 1, wherein said inclined surfaces are substantially rectangular.

9. The crystal unit according to claim 1, wherein the spacing between the excitation electrodes is uniform.

* * * * *